(12) United States Patent
Ma

(10) Patent No.: US 7,524,726 B2
(45) Date of Patent: Apr. 28, 2009

(54) METHOD FOR FABRICATING A SEMICONDUCTOR DEVICE

(75) Inventor: Ling Ma, Torrance, CA (US)

(73) Assignee: International Rectifier Corporation, El Segundo, CA (US)

( * ) Notice: Subject to any disclaimer, the term of this patent is extended or adjusted under 35 U.S.C. 154(b) by 14 days.

(21) Appl. No.: 11/504,740

(22) Filed: Aug. 15, 2006

(65) Prior Publication Data

US 2007/0042552 A1 Feb. 22, 2007

Related U.S. Application Data

(60) Provisional application No. 60/709,020, filed on Aug. 17, 2005.

(51) Int. Cl.
*H01L 21/336* (2006.01)

(52) U.S. Cl. .................. 438/270; 438/259; 438/268; 438/424; 438/425; 438/589; 257/330; 257/E29.201

(58) Field of Classification Search .......... 438/270, 438/268, 424, 425, 589; 257/330, E29.201
See application file for complete search history.

(56) References Cited

U.S. PATENT DOCUMENTS

| 5,430,315 | A | 7/1995 | Rumennik |
| 6,489,204 | B1 * | 12/2002 | Tsui ..................... 438/270 |
| 6,580,123 | B2 | 6/2003 | Thapar |
| 6,806,533 | B2 | 10/2004 | Henninger et al. |
| 6,833,583 | B2 | 12/2004 | In't Zandt et al. |
| 6,838,735 | B1 | 1/2005 | Kinzer et al. |
| 7,081,388 | B2 * | 7/2006 | Jones ..................... 438/270 |
| 2003/0127702 | A1 | 7/2003 | Blair et al. |
| 2004/0137684 | A1 * | 7/2004 | Ma et al. .............. 438/270 |
| 2005/0112823 | A1 * | 5/2005 | Cao et al. ............. 438/270 |
| 2005/0224891 | A1 * | 10/2005 | Xu ..................... 257/382 |

FOREIGN PATENT DOCUMENTS

| WO | WO 01/20684 A1 | 3/2001 |
| WO | WO 03/023861 A2 | 3/2003 |

OTHER PUBLICATIONS

International Search Report dated Feb. 21, 2007 for PCT/US06/02848.
International Search Report dated Apr. 24, 2007 for PCT/US06/32060.

* cited by examiner

*Primary Examiner*—Andy Huynh
(74) *Attorney, Agent, or Firm*—Ostrolenk, Faber, Gerb & Soffen, LLP

(57) ABSTRACT

A process for fabricating a power semiconductor device is disclosed.

11 Claims, 10 Drawing Sheets

METHOD FOR FABRICATING A SEMICONDUCTOR DEVICE

RELATED APPLICATION

This application is based on and claims benefit of U.S. Provisional Application Ser. No. 60/709,020, filed on Aug. 17, 2005, entitled Trench MOSFET Process Using Four Masks, to which a claim of priority is hereby made and the disclosure of which is incorporated by reference.

BACKGROUND OF THE INVENTION

The present invention relates to semiconductor fabrication and more particularly to a method for fabricating a power semiconductor device such a power MOSFET.

Photolithography is a well known and prevalently used technique in the fabrication of semiconductor devices, such as power MOSFETs or the like. In general terms, photolithography involves the deposition of mask material over the surface of a semiconductor body and the selective removal of the mask material in order to form a mask having openings therein. The mask is then used to define features in the semiconductor body. For example, dopants can be implanted through the mask openings into the semiconductor body, or portions of the semiconductor body can be removed through the openings in order to recess or "trench" the semiconductor body as desired.

In a typical fabrication process, several masks may be required. For example, a mask may be required to define gate trenches, or a mask may be required to define source regions.

It is desirable to reduce the number of masks because generally speaking increasing the number of masks leads to more complexity in the fabrication process, which increases cost, and also more masks increase the chances of obtaining a higher percentage of defective parts, thereby reducing yield and increasing the overall cost.

SUMMARY OF THE INVENTION

It is an object of the present invention to provide a process for manufacturing a power semiconductor device, for example, a power MOSFET.

A process according to the present invention includes covering a surface of a semiconductor body with a mask body, removing portion of the mask body to define openings extending to the semiconductor body, removing semiconductor from bottoms of the openings to define a plurality of gate trenches and a termination trench disposed around the gate trenches, the trenches being spaced from one another by mesas, removing the mask body, oxidizing the sidewalls of the gate trenches, depositing gate electrode material, etching back the gate electrode material to leave gate electrodes in the trenches, implanting channel dopants to define a body region adjacent the trenches, forming a source mask over the body region, implanting source dopants through the source mask to form source implant regions, depositing a low density oxide over the semiconductor body, depositing a contact mask, etching the low density oxide through the contact mask, depositing a metal layer atop the semiconductor body, forming a front metal mask atop the metal layer, and etching the metal layer to form at least a source contact, and a gate runner.

Thus, in a process according to the present invention a power semiconductor device can be obtained using four masks, namely, a trench mask for defining gate trenches and a termination trench, a source mask, a contact mask, and a mask for defining a source electrode and a gate electrode.

A process according to the present invention may further include forming an oxidation retardant body on at least the sidewalls of the gate trenches and at least a sidewall of the termination trench, and growing a thick oxide at the bottom of the gate trenches and the termination trench. The oxidation retardant body can be then removed prior to oxidizing the sidewalls of the gate trenches, and then the process can further include oxidizing the mesas, depositing gate electrode material over the mesas, etching away gate electrode material from the mesas, and etching away oxide from the mesas prior to source implantation.

In another variation, an opening can be defined in the mask body, and portions of the semiconductor body can be removed to define an equipotential ring (EQR) trench around the termination trench.

Other features and advantages of the present invention will become apparent from the following description of the invention which refers to the accompanying drawings.

DETAILED DESCRIPTION OF THE FIGURES

Figure 1:
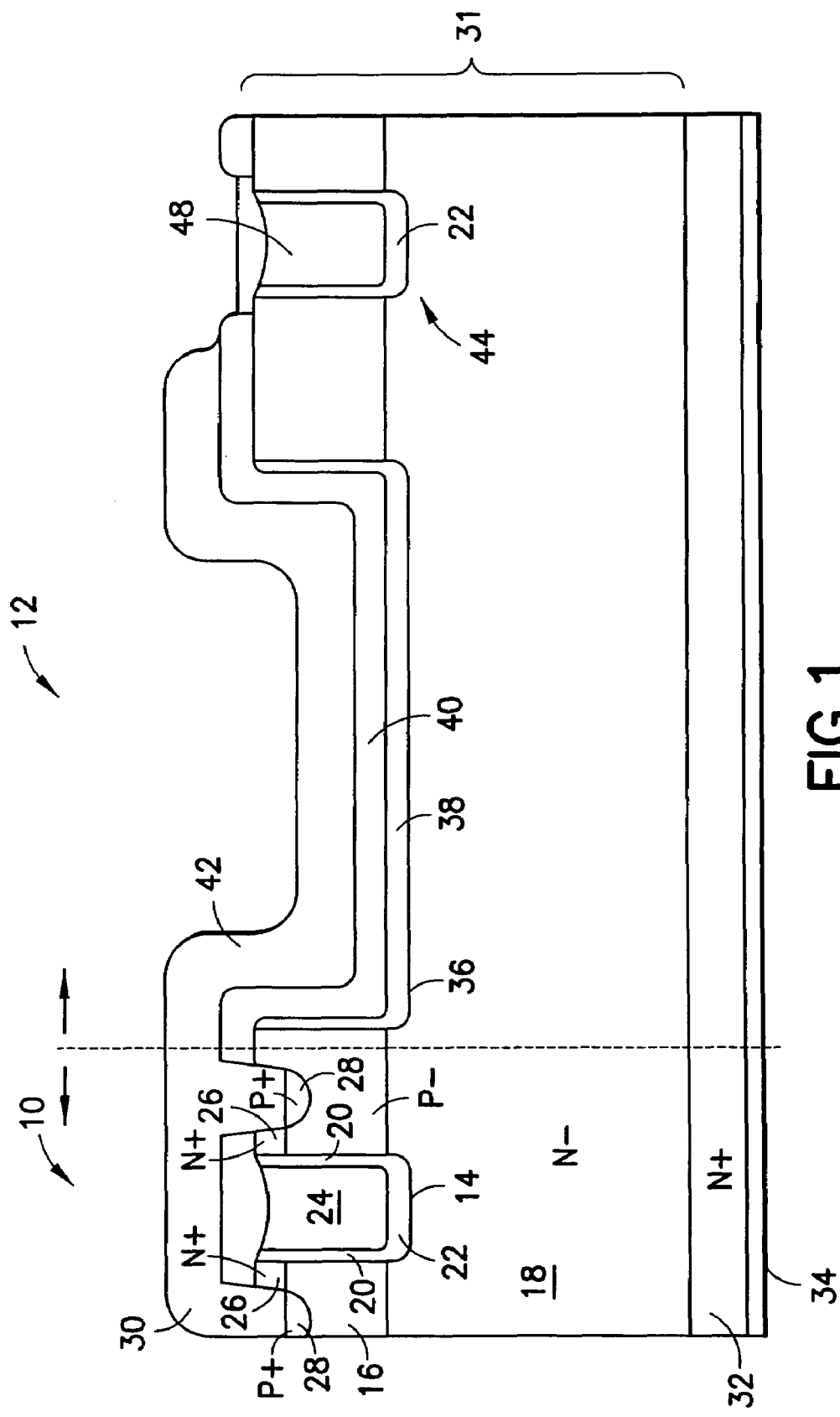
FIG. 1 schematically illustrates a cross-sectional view of a portion of a device fabricated according to the preferred embodiment of the present invention.

Referring to FIG. 1, a device according to the present invention is preferably a power MOSFET, which includes an active region 10 and a termination region 12. Active region 10 includes at least one gate trench 14 which extends through base region 16 to drift region 18. Gate oxide (e.g., $S_iO_2$) 20 is formed on the sidewalls of gate trench 14 to an appropriate thickness (e.g. 1000 Å), thick oxide (e.g., $S_iO_2$) 22 (thicker than gate oxide 20) is formed at the bottom of gate trench 14, and gate electrode 24 (preferably formed with conductive polysilicon) is formed inside trench 14.

Active region further includes source regions 26 adjacent trench 14 and formed in base region 16, and highly conductive contact regions 28 formed in base region 16. Source contact 30 is ohmically connected to source regions 26, and highly conductive contact regions 28. Note that as is well known base region 16 and highly conductive contact regions 28 are of opposite polarity to source regions 26 and drift region 18. Thus, in an N-channel device, base region 16 and highly conductive contact regions 28 are of P variety, while drift region 18 and source regions 26 are of the N variety. A device according to the present invention further includes silicon substrate 32 of the same polarity as drift region 18, and drain contact 34, which is ohmically connected to substrate 32. Note that, as is conventionally known drift region 18, and base region 16 are part of an epitaxially grown silicon body 31 that is grown over substrate 32.

Termination region 12 includes termination trench 36, which is disposed around active region 10 and extends to a depth below that of base region 16, first silicon dioxide body 38 which overlies the bottom surface and the sidewalls of termination trench 38, and second silicon dioxide body 40 overlying first silicon dioxide body 38. First silicon dioxide body 38 is grown oxide meaning that it is formed by growing silicon dioxide through oxidizing the epitaxially grown silicon body 31, and second silicon dioxide body 40 is formed by depositing a low density silicon dioxide body 40 such as TEOS. Together, first and second silicon dioxide bodies 38, 40 form a field insulation body. An extension of source contact 30 overlies second silicon dioxide body 40, thereby forming a field plate 42. Preferably, termination region 12 further includes an equipotential ring (EQR) structure 44 disposed around termination trench 36. EQR 44 includes EQR trench 46 having silicon dioxide disposed on its sidewalls and bottom, and polysilicon disposed therein.

FIGS. 2A-2H illustrate schematically a method according to the present invention.

Figure 2A:
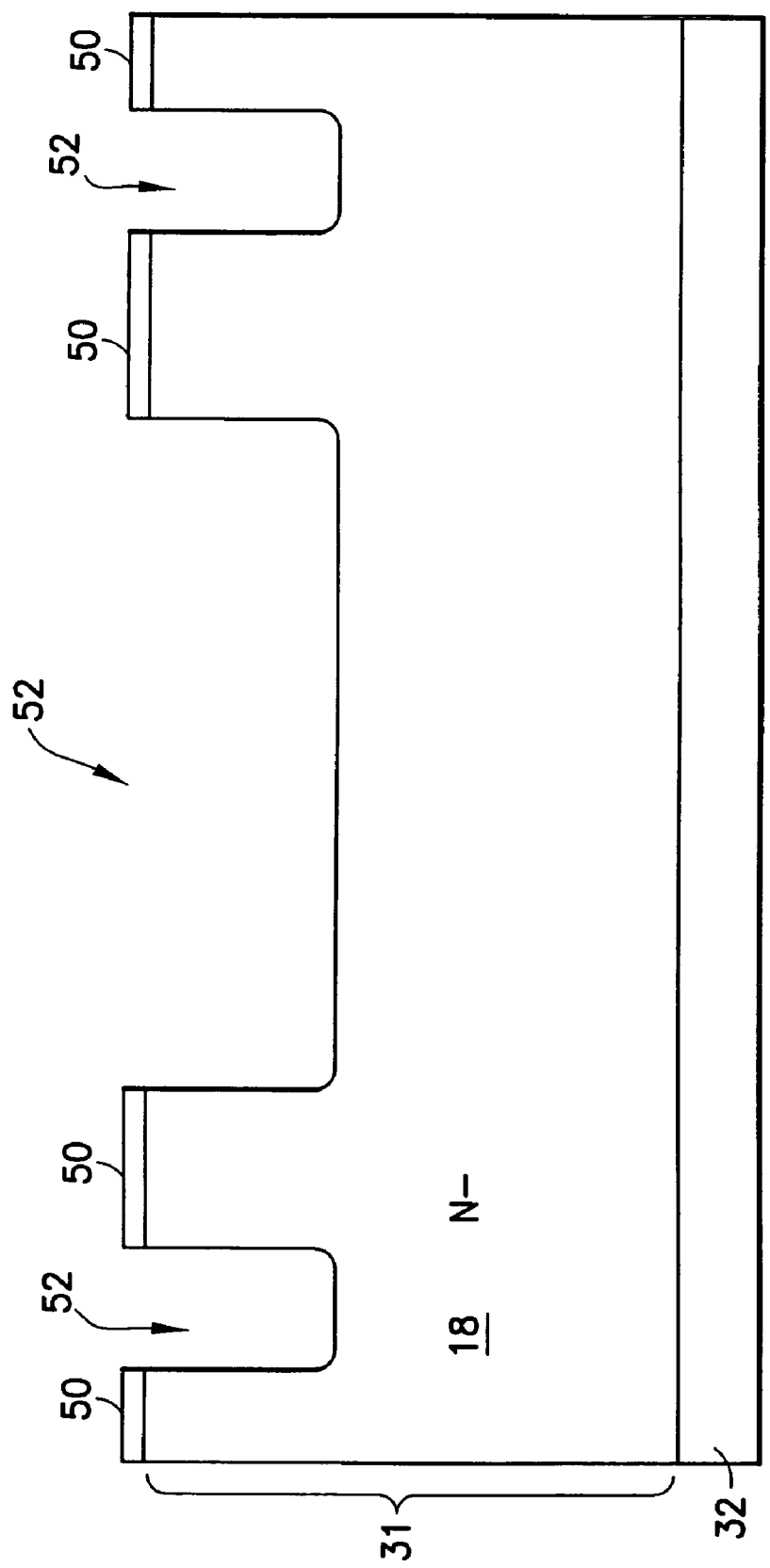
FIGS. 2A-2H illustrate a process for fabricating a power semiconductor device according to a preferred embodiment of the present invention.

Referring to FIG. 2A, starting with a silicon substrate 32 having an epitaxial silicon body 31 formed thereon, a hard mask 50 is first formed over a surface of, for example, N-type epitaxially grown silicon 31. Hard mask 50 is formed by depositing a hard mask body made from, for example, silicon nitride ($Si_3N_4$), defining openings 52 in the hard mask body, and removing silicon from the bottom of openings 52 to define gate trench 14, termination trench 36 and EQR trench 44.

Figure 2B:
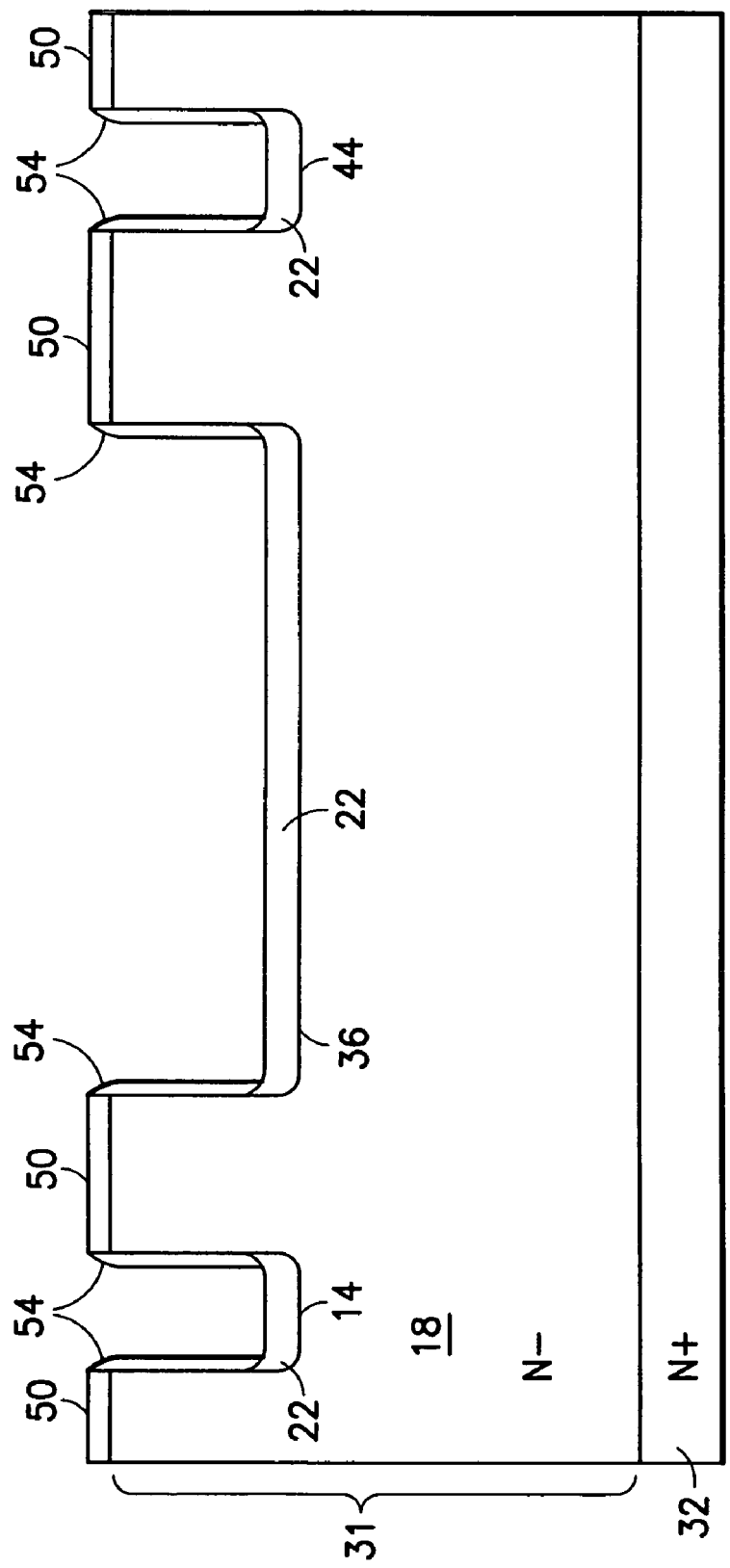

Next, oxidation retardant body 54 such as $Si_3N_4$ is formed on the sidewalls of gate trench 14, termination trench 36, and EQR trench 44. Thereafter, the bottoms of gate trench 14, termination trench 36 and EQR trench 44 are oxidized to form thick oxide body 22, as illustrated by FIG. 2B.

Figure 2C:
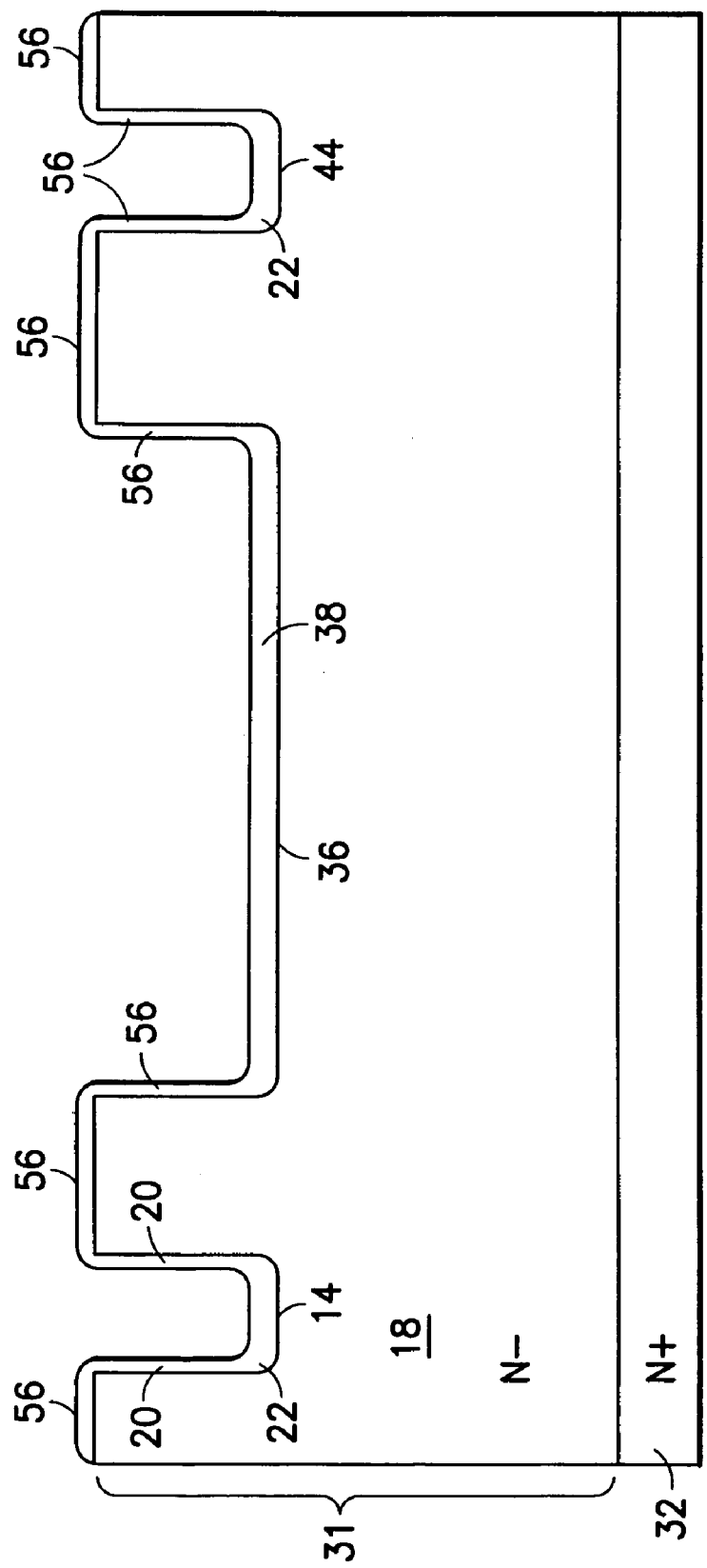
Figure 2D:
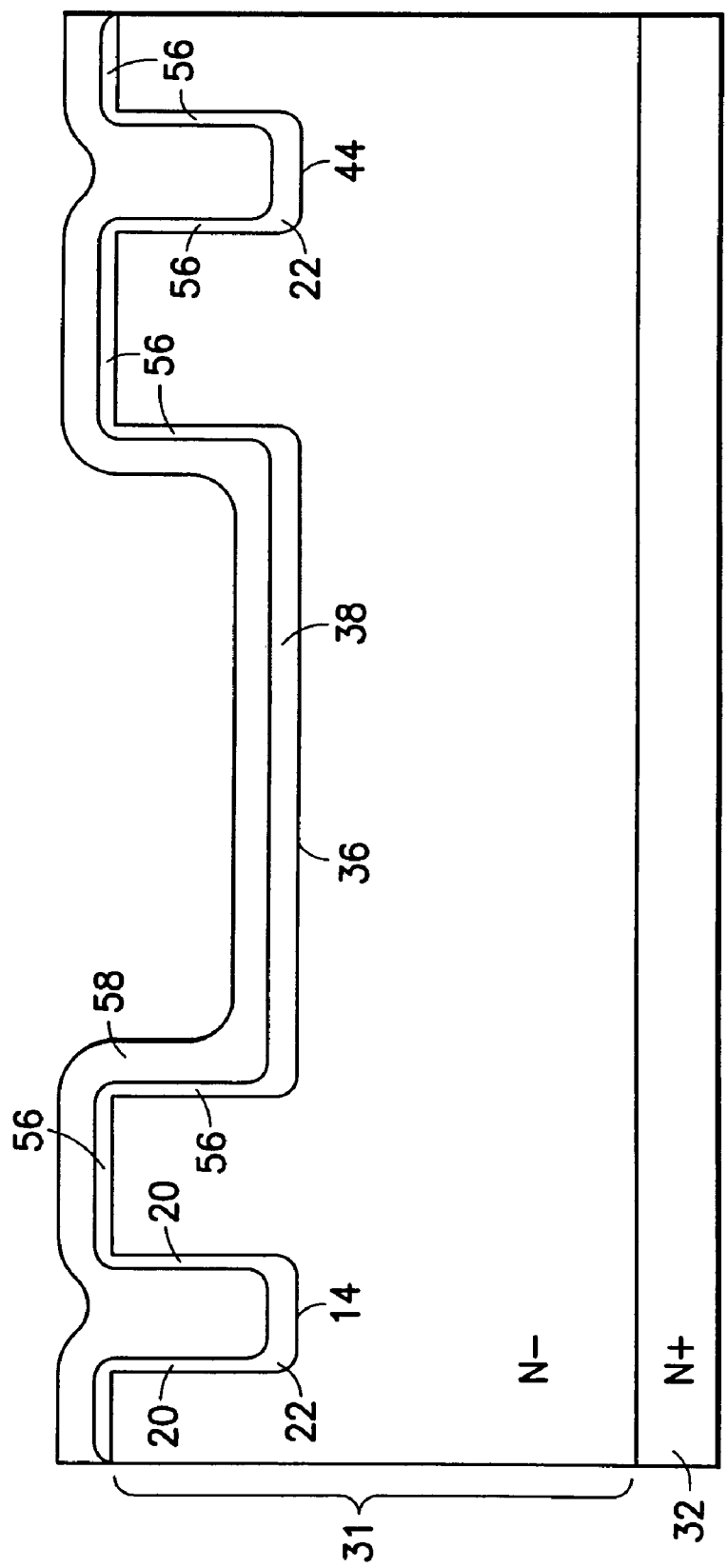
Figure 2E:
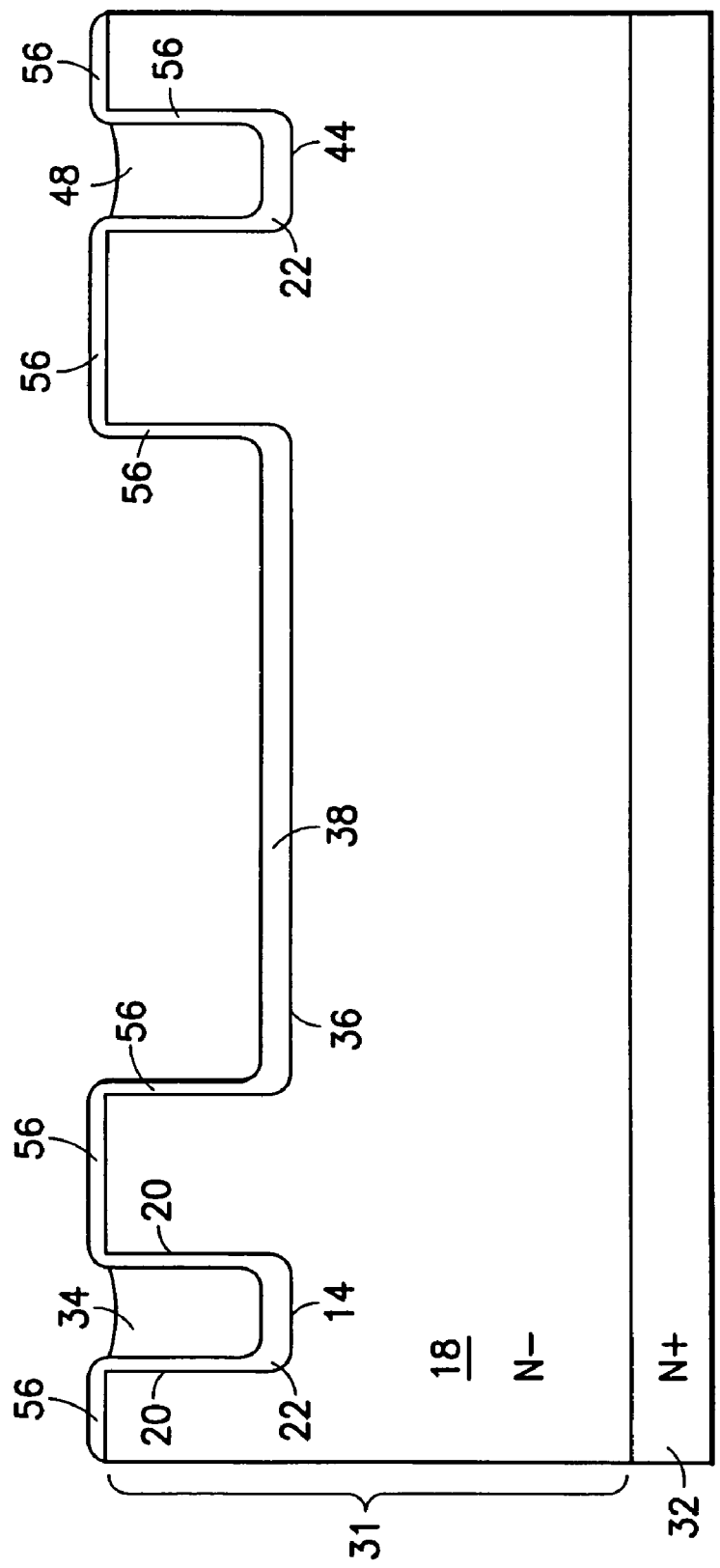
Figure 2E:
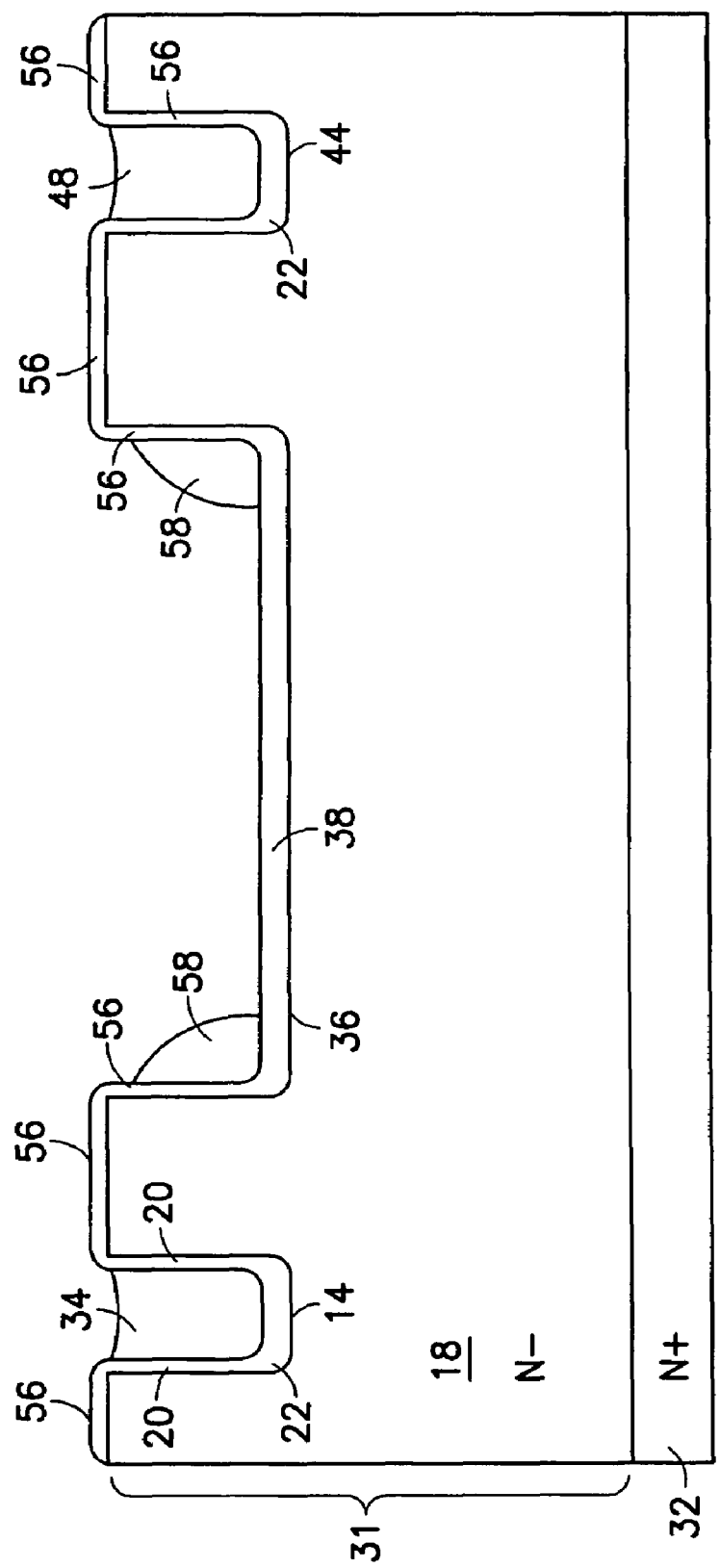

Referring next to FIG. 2C, mask 50, and oxidation retardant bodies 54 are removed and the exposed silicon is oxidized which results in the formation of gate oxide 20 on the sidewalls of gate trench 14, and an oxide liner 56 on the rest of exposed silicon including the sidewalls of termination trench 36, the sidewalls of EQR trench 44, and the mesas between trenches 14, 36, 44. Note that oxide liner 56 on the sidewalls of termination trench 36 and thick oxide 22 at the bottom of termination trench 36 form first oxide body 38. Thereafter, polysilicon 58 is deposited as illustrated in FIG. 2D. Polysilicon 58 may be rendered conductive by dopant implantation after its deposition, or rendered conductive by in situ doping. Then, polysilicon 58 is removed leaving gate electrode 24 in gate trench 14, and polysilicon body 48 in EQR trench 44 as illustrated by FIG. 2E. Alternatively, polysilicon spacers 59 are left on the sidewalls of termination trench 36 as illustrated in FIG. 2E'. Polysilicon spacers 58 may be electrically floating.

Figure 2F:
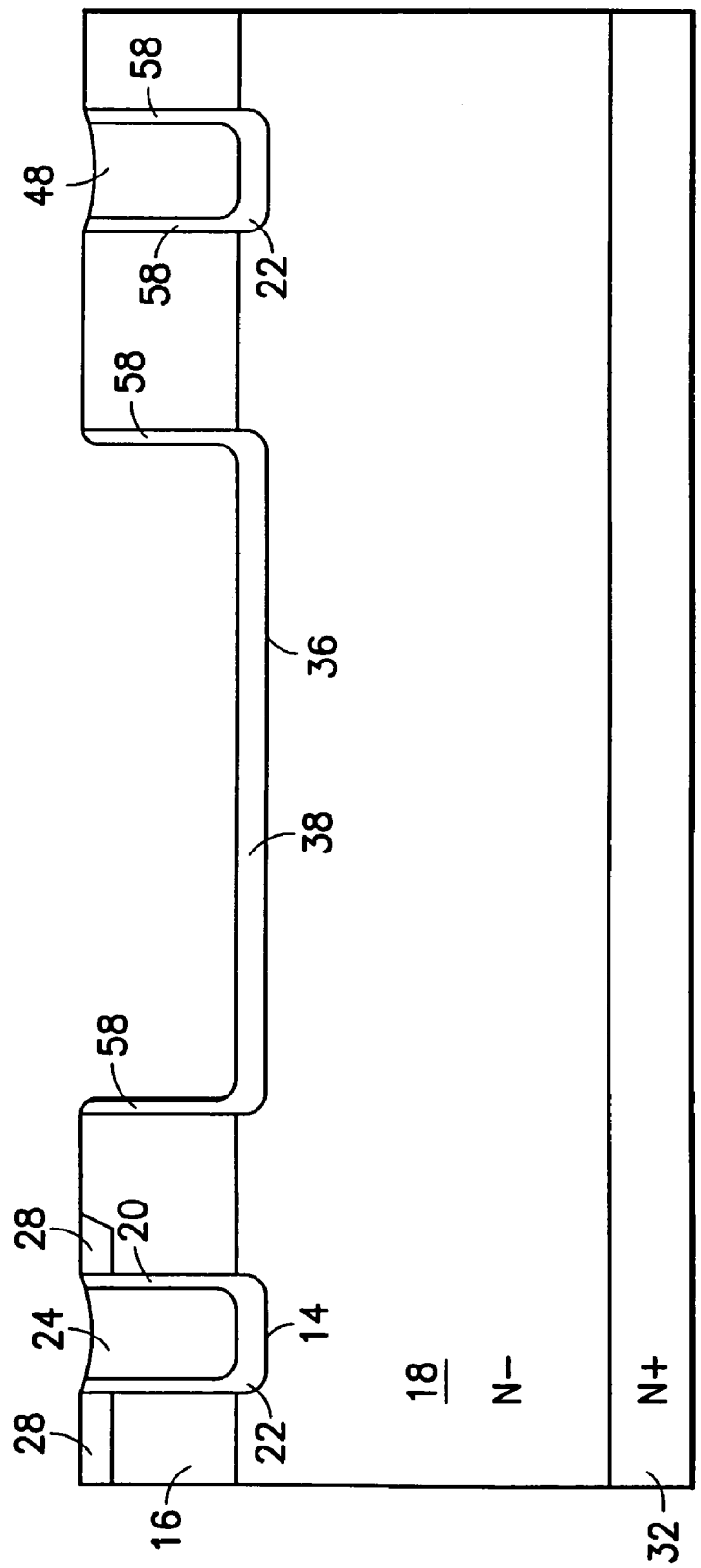
Figure 2G:
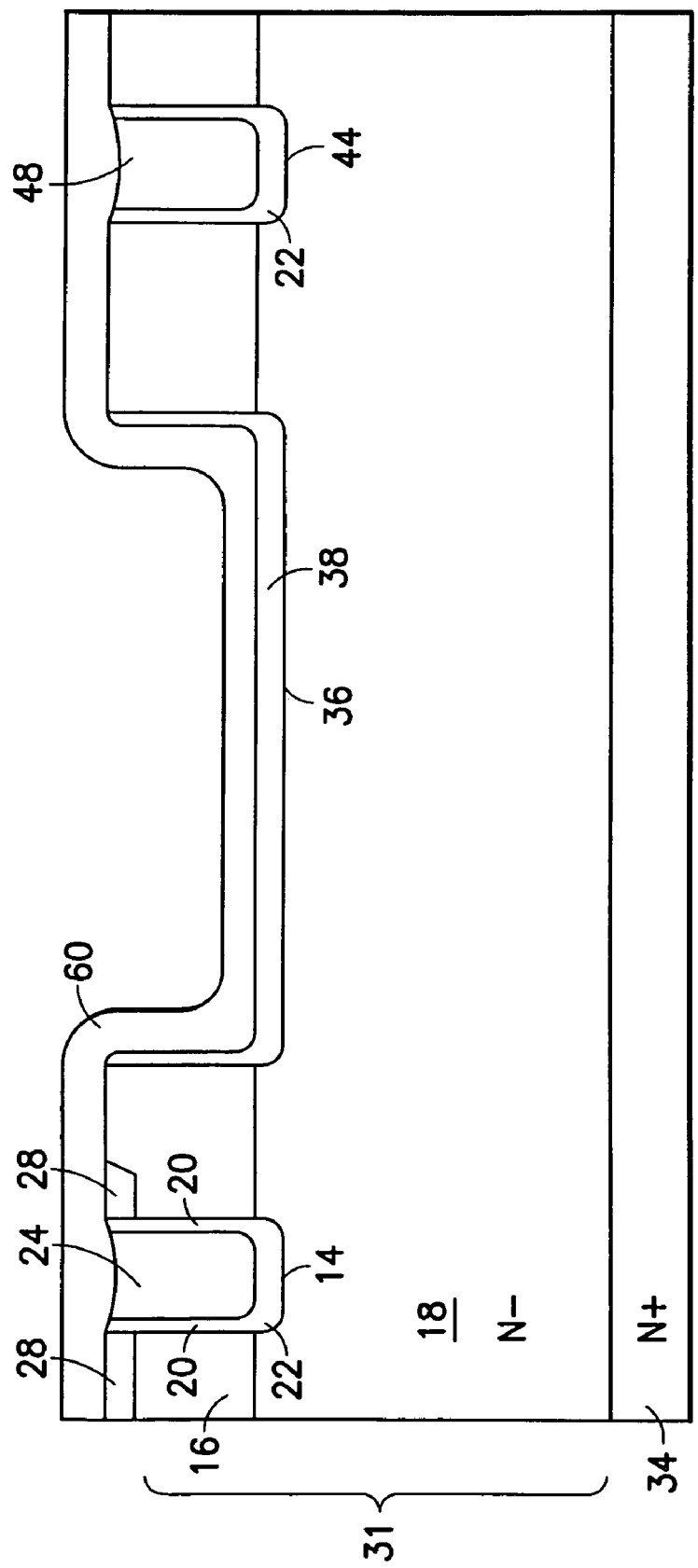
Figure 2H:
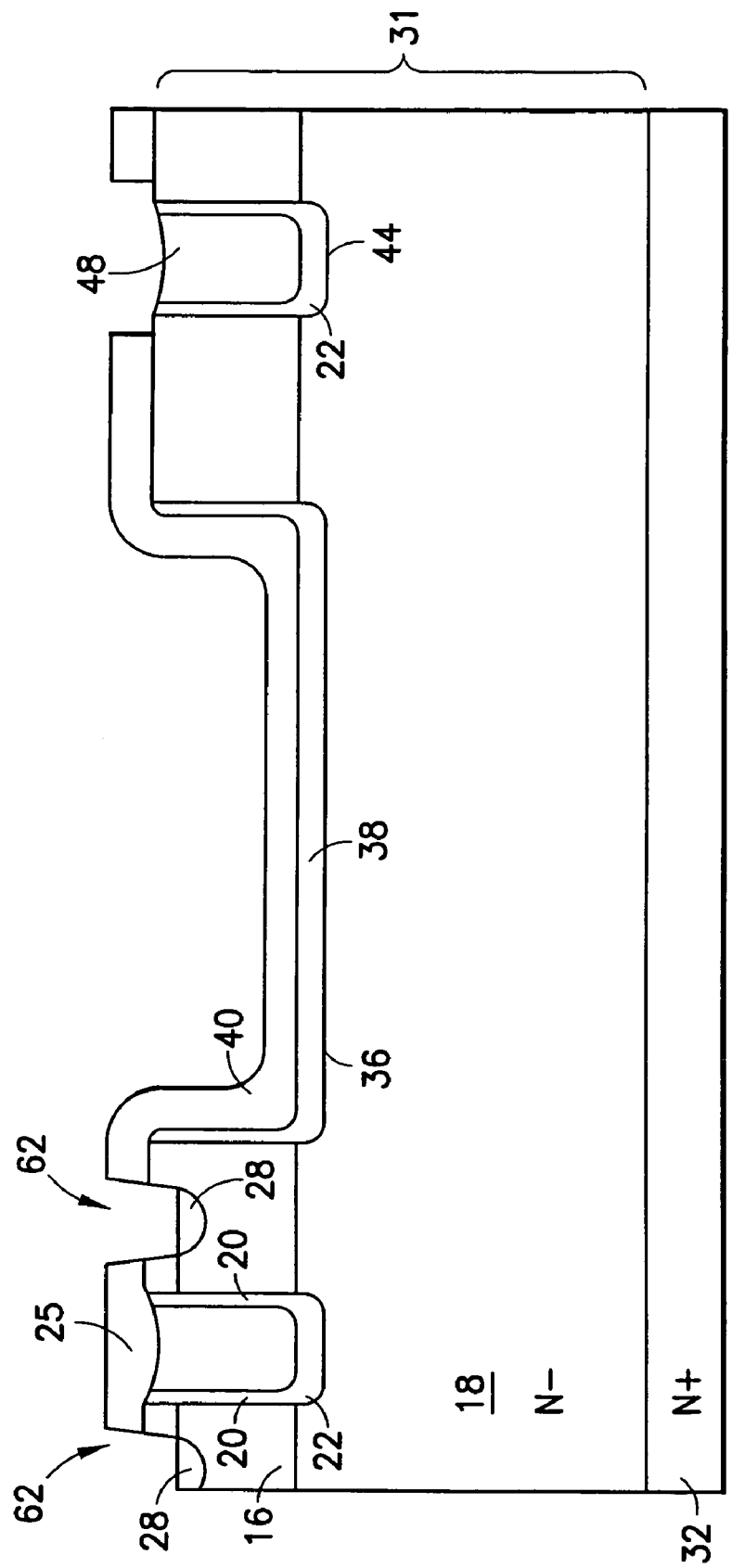

Referring next to FIG. 2F, oxide 56 is removed from atop the mesas between trenches 14, 36, 44, and dopants for forming base region 16 are implanted. Note that thick oxide 22 at the bottom of termination trench 36 prevents the dopants from penetrating into the silicon below the bottom of trench 36. After base implantation, a source mask is applied and source dopants are implanted. The source and the base implants are then activated to form base region 16 and source regions 28. Thereafter, a low density oxide layer 60, such as TEOS, is deposited as illustrated by FIG. 2G. Low density oxide is then patterned in a masking step and portions thereof are removed to form contact openings 62 therein as illustrated in FIG. 2H. Note that as a result, second oxide body 40, and oxide plug 25 are formed. Through each opening 62, a portion of silicon is removed resulting in a recess, and dopants of the same conductivity as base region 16 (e.g. P-type) are implanted and activated to form highly conductive contact regions 28.

Thereafter, a metal layer (e.g. aluminum) is deposited over the top side of silicon and in another masking step patterned to obtain source contact 30 and the gate contact for the device. Drain contact 34 is then formed on substrate 32 to obtain a device according to FIG. 1.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of fabricating a power semiconductor device, comprising:

covering a surface of a semiconductor body with a mask body;

removing portions of said mask body to define openings extending to said semiconductor body;

removing a portion of said semiconductor body from bottoms of said openings in said mask body to define a plurality of gate trenches and a termination trench disposed around said gate trenches, said trenches being spaced from one another by mesas;

removing said mask body;

oxidizing the sidewalls of said gate trenches;

depositing gate electrode material;

etching back said gate electrode material to leave gate electrodes in said trenches;

implanting channel dopants adjacent said gate trenches after said gate trenches are defined;

forming a source mask;

implanting source dopants through said source mask;

activating said source dopants and said channel dopants to form a base region and source regions;

depositing a low density oxide over said semiconductor body;

depositing a contact mask;

etching said low density oxide through said contact mask;

depositing a metal layer atop said semiconductor body;

forming a front metal mask atop said metal layer; and etching said metal layer to form at least a source contact, and a gate runner.

2. The method of claim 1, further comprising, forming an oxidation retardant body on at least the sidewalls of said gate trenches and at least a sidewall of said termination trench;

growing a thick oxide at the bottom of said gate trenches and said termination trench.

3. The method of claim 2, further comprising, removing said oxidation retardant bodies prior to oxidizing said sidewalls of said gate trenches;

oxidizing said mesas;

depositing gate electrode material over said mesas;

etching away gate electrode material from said mesas; and etching away oxide from said mesas, prior to source implantation.

4. The method of claim 1, wherein said semiconductor body is epitaxially grown silicon.

5. The method of claim 1, wherein said mask body is a hard mask comprising of silicon nitride.

6. The method of claim 2, wherein said oxidation retardant bodies are comprised of silicon nitride.

7. The method of claim 1, wherein said low density oxide is comprised of TEOS.

8. The method of claim 1, wherein said gate material is comprised of polysilicon.

9. The method of claim 1, further comprising defining an EQR opening in said mask body, and removing portions of said semiconductor body to define an EQR around said termination trench.

10. The method of claim 1, wherein said power semiconductor device is a MOSFET.

11. The method of claim 1, wherein said semiconductor body is disposed on a semiconductor substrate and further comprising forming a back metal layer over said substrate.

* * * * *